(12) United States Patent
Lankhorst et al.

(10) Patent No.: US 9,383,069 B2
(45) Date of Patent: Jul. 5, 2016

(54) OPTIMIZED PRINTED CIRCUIT BOARD

(71) Applicant: KONINKLIJKE PHILIPS N.V., Eindhoven (NL)

(72) Inventors: Martijn Henri Richard Lankhorst, Eindhoven (NL); Antonius Petrus Marinus Dingemans, Tilburg (NL); Noud Johannes Fleuren, Baarlo (NL); Bertrand Jean-Bernard Navarro, Eindhoven (NL); Kamil Mert Cakar, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 25 days.

(21) Appl. No.: 14/413,013

(22) PCT Filed: Jul. 10, 2013

(86) PCT No.: PCT/IB2013/055677
§ 371 (c)(1),
(2) Date: Jan. 6, 2015

(87) PCT Pub. No.: WO2014/009906
PCT Pub. Date: Jan. 16, 2014

(65) Prior Publication Data
US 2015/0198293 A1 Jul. 16, 2015

Related U.S. Application Data

(60) Provisional application No. 61/670,682, filed on Jul. 12, 2012.

(30) Foreign Application Priority Data

Jul. 12, 2012 (EP) .................................... 12176205

(51) Int. Cl.
*F21V 23/00* (2015.01)
*F21K 99/00* (2016.01)
*H05K 3/00* (2006.01)
*F21S 8/00* (2006.01)
*H05K 1/14* (2006.01)
*H05K 1/18* (2006.01)
*F21V 3/00* (2015.01)
*F21Y 101/02* (2006.01)
*F21Y 105/00* (2016.01)

(52) U.S. Cl.
CPC ... *F21K 9/30* (2013.01); *F21K 9/50* (2013.01); *F21K 9/90* (2013.01); *F21S 8/00* (2013.01);
(Continued)

(58) Field of Classification Search
CPC . F21V 23/005; F21Y 2105/001; H05K 1/142; H05K 1/18; H05K 2201/10106; H05K 2201/09; H05K 3/0052; H05K 3/0097; Y10T 29/4913; F21S 8/00; F21S 4/28
USPC .................. 257/88; 361/792, 650; 29/832
See application file for complete search history.

(56) References Cited

U.S. PATENT DOCUMENTS 8,307,547 B1 * 11/2012 Cobb .................. H05K 3/0052
29/592.1
2008/0143916 A1 6/2008 Fujino et al.
(Continued)

FOREIGN PATENT DOCUMENTS

DE     19712879 A1    10/1998
DE  102010008876 A1     8/2011
(Continued)

*Primary Examiner* — Julie Bannan

(57) ABSTRACT

The present invention relates to a printed circuit board (100, 200) comprising several finger portions (102, 103, 104) projecting from a base portion (101), wherein each linger portion is provided with a plurality of light emitting elements (106). By means of the invention it is possible to optimize the physical size of the printed circuit board (100, 200) such that a resulting LED module requires less printed circuit board area per thereon arranged LED, thereby decreasing the cost of the overall LED module.

13 Claims, 4 Drawing Sheets

(52) U.S. Cl.
CPC ............. *F21V 23/001* (2013.01); *F21V 23/003* (2013.01); *H05K 1/142* (2013.01); *H05K 1/18* (2013.01); *H05K 3/0052* (2013.01); *H05K 3/0097* (2013.01); *F21V 3/00* (2013.01); *F21Y 2101/02* (2013.01); *F21Y 2105/001* (2013.01); *H05K 2201/10106* (2013.01); *Y10T 29/4913* (2015.01)

(56) References Cited

U.S. PATENT DOCUMENTS

| | | | | |
|---|---|---|---|---|
| 2009/0267533 | A1* | 10/2009 | Lee | G09F 9/33 315/294 |
| 2010/0220046 | A1* | 9/2010 | Plotz | F21K 9/00 345/102 |
| 2010/0265711 | A1* | 10/2010 | Lee | H05K 1/142 362/249.06 |
| 2011/0019413 | A1* | 1/2011 | Zimmerman | G09F 13/22 362/249.02 |
| 2011/0096517 | A1 | 4/2011 | Yada et al. | |
| 2011/0198622 | A1* | 8/2011 | Amelung | H01L 27/3204 257/88 |
| 2014/0022517 | A1* | 1/2014 | Villeflose | G03B 21/2053 353/85 |
| 2014/0091335 | A1* | 4/2014 | Satake | F21S 4/006 257/88 |

FOREIGN PATENT DOCUMENTS

| | | |
|---|---|---|
| EP | 2227074 A1 | 9/2010 |
| WO | 2009022661 A1 | 2/2009 |

* cited by examiner

OPTIMIZED PRINTED CIRCUIT BOARD

CROSS-REFERENCE TO PRIOR APPLICATIONS

This application is the U.S. National Phase application under 35 U.S.C. §371 of International Application No. PCT/IB13/055677, filed on Jul. 10, 2013, which claims the benefit of U.S. Provisional Patent Application No. 61/670,682, filed on Jul. 12, 2012 or European Patent Application No. 12176205.8 filed on Jul. 12, 2012. These applications are hereby incorporated by reference herein.

FIELD OF THE INVENTION

The invention relates to printed circuit boards (PCBs) comprising light emitting elements, as well as low cost luminaires with PCBs comprising light emitting elements.

BACKGROUND OF THE INVENTION

Historically most luminaires comprise conventional light sources such as light bulbs. However, nowadays many conventional light bulbs have been replaced with light emitting diodes (LED) modules in order to decrease energy consumption and environmental impact. The cost for a large luminaire, used in e.g. office and industry settings, with LED light sources becomes significant partly due to the cost of printed circuit boards (PCBs). State of the art provides means for decreasing the cost of large LED luminaires by e.g. using low cost PCB materials such as CEM1 or using large PCBs to decrease the number of PCBs required in a luminaire, in turn reducing the amount of cables and connections between the PCBs. However, using large PCBs is also a cost driver.

In other PCB applications, there are examples of how a PCB panel can be efficiently utilized for creating a plurality of PCBs. One example, as shown in DE19712879, is to design a PCB with apertures, where the apertures can be used for another PCB.

However, when it comes to luminaires, the light distribution is important, which is usually not a parameter to consider in other technologies. Accordingly, this complicates designing the PCB for such a luminaire. Thus, it is desirable to decrease costs for PCBs in luminaires that are able to provide a uniform light distribution.

SUMMARY OF THE INVENTION

The object of the invention is to decrease costs for a printed circuit board (PCB) providing a uniform light distribution and which comprises a plurality of light emitting elements arranged on a common PCB.

The invention is based on the inventors' realization that by providing a PCB comprising several finger portions projecting from a base portion, where each finger portion is provided with a plurality of light emitting elements, it is possible to optimize the physical size of the PCB such that the PCB requires less PCB material area per light emitting element, thereby decreasing the cost of the overall PCB.

Further, by assuring a certain aperture or spacing between each finger portion, the PCB material that originates from the aperture or spacing can be used for a finger portion of another PCB (below called a "nested design"). Moreover, in order to avoid high assembly costs, it is desirable to arrange two rows of light emitting elements aligned substantially parallel on each finger portion.

Further, the inventors have realized that with a nested design with two rows of light emitting elements per finger portion it is difficult to achieve a uniform light distribution, since the light emitting elements must be arranged with at least a few millimeters distance from the edges of the finger portions to be able to meet creepage requirements, resulting in a pitch between two light emitting elements on different finger portions that is larger than the pitch between two light emitting elements on the same finger portion. However, the inventors have realized that by providing the finger portions of a PCB with a plurality of longitudinal protrusions distributed along at least a first side of the finger portions and arranging the light emitting elements on the protrusions, a uniform light distribution can be achieved. The longitudinal protrusions extend in a direction that is substantially perpendicular to the main, or length, direction of the finger portions.

According to an aspect of the invention, there is provided a printed circuit board comprising a base portion extending in a longitudinal direction, at least two finger portions extending in a transversal direction and being substantially parallel to each other, each of the at least two finger portions being provided with a plurality of light emitting elements aligned in a first and a second row, wherein two adjacent finger portions define an intermediate aperture with a shape corresponding to at least one of the finger portions. A corresponding shape means that both the finger portion and the intermediate aperture can have the same shape, but it may also mean a similar shape, for instance both the finger portion and the intermediate aperture may be a rectangle, but not necessarily of the same dimensions. Further, the at least two finger portions each may have a plurality of longitudinal protrusions distributed along at least a first side of the at least two finger portions, and the light emitting elements forming part of at least one of the first or the second rows are arranged on the protrusions.

In the context of the application a "uniform light distribution" should be understood arranging the light emitting elements for achieving an even light distribution. It does not necessarily mean that all light emitting elements on the PCB must be placed with a constant or identical pitch. However, such a design would also constitute a uniform light distribution. In other embodiments, the light emitting elements may for example be placed in such a way that an outer frame of light emitting elements in combination with an inner uniform pattern of light emitting elements is achieved.

Further, in the context of the application "light emitting elements" should be understood as any electrical component emitting light. One such example is a light emitting diode (LED).

Within the context of the application, a PCB together with the light emitting elements constitutes, in the embodiment where the light emitting elements are light emitting diodes (LEDs), a LED module.

A design according to the inventive concept as described above provides PCBs with decreased costs compared to prior art PCBs. The reduced cost is derived from the fact that less PCB material per PCB is required in this inventive design because of the possibility to form new PCBs from the intermediate material. That is, two nested PCBs may be cut out from a common PCB panel area which is substantially smaller than the PCB panel area required for two regular, prior art, PCBs.

Moreover, by arranging the light emitting elements on the available longitudinal protrusions, a uniform light distribution is achieved despite the fact that two rows of aligned light emitting elements are placed on each finger portion.

Furthermore, most PCBs in a luminaire have a given dimension and a given number of LEDs required for the luminaire. By providing two rows of light emitting elements on each finger portion the number of required finger portions can be decreased, instead of providing wider finger portions, thus resulting in an increased mechanical stability of the finger portions. Additionally, by reducing the amount of finger portions the cost for assembly is reduced, since each finger portion must be anchored with a screw or other equivalent mechanical fixation means. Thereby, a PCB with a uniform light distribution and a mechanically stable construction is provided with a reduced cost per PCB.

In one embodiment, each light emitting element arranged on the base portion constitutes an outermost arranged light emitting element of one of the first or second rows of aligned light emitting elements arranged on the finger portion. Thereby, a uniform light distribution may be enabled. Moreover, an implementation where the pitch, or distance, between each light emitting element is substantially constant may be achieved.

According to another embodiment, the first side of the finger portions each forms a meandering contour. Thereby, the protrusions on the PCB can be achieved by a realtively simple design. Further, a meandering contour allows for providing another PCB also comprising corresponding protrusions, as part of the nested design formed from a PCB panel thereby providing for two PCBs.

According to yet another embodiment, two adjacent longitudinal protrusions define an intermediate aperture, i.e. an aperture in between adjacent protrusions, with a shape that corresponds to at least one of the longitudinal protrusions. Thereby, the aperture in between the adjacent longitudinal protrusions is formed as part of a nested design formed from a PCB panel, wherein the protrusions on one PCB correspond to the apertures of another PCB, and vice versa.

In one embodiment, the corresponding shape of the finger portions may be mirrored, and the material cut out from the aperture can be used to form a corresponding finger portion of another PCB.

According to another embodiment, the PCB comprises at least three finger portions extending in a transversal direction, i.e. substantially perpendicular from the base portion. Thereby, a PCB can be formed with a larger area than in the embodiment that only two finger portions are used, which may be desirable in many luminaires.

According to yet another embodiment, an intermediate finger portion comprises an end portion protruding longitudinally, wherein aligned light emitting elements are longitudinally arranged on the end portion.

According to another embodiment, a plurality of finger portions extend in a transversal direction, i.e. substantially perpendicular, from the base portion wherein all intermediate finger portions comprise an end portion protruding longitudinally and wherein aligned light emitting elements are longitudinally arranged on the end portions. Thereby, the light emitting elements may be arranged in such a way that an outer frame of light emitting elements is achieved. Thereby, the intensity of light emitted from the outer frame of the PCB can be adjusted. In some embodiments it may be desirable to increase the intensity of light emitted from the frame. In other embodiments it may be desirable to decrease the intensity of light emitted from the frame.

According to yet another embodiment, the light emitting elements are distributed in such a way that the light emitting elements form an outer frame and an inner uniform pattern. Thereby, the intensity of light emitted from the PCB may be varied with an outer frame light intensity and a uniform inner light distribution intensity. This may be desirable for producing a light distribution which is pleasant for the eye without any high contrast sections. For example, if a luminaire has a relatively high intensity of distributed light in the center, the human eye would perceive a higher contrast from that luminaire than if the light emitted from the center is decreased relative to the light emitted from the light emitting elements in the outer frame.

According to another embodiment, the outer frame is provided with light emitting elements arranged on the base portion, on the end portions protruding longitudinally from the intermediate finger portions and on the two outermost arranged finger portions.

In one embodiment the outer frame is formed as a square. In another embodiment the outer frame is formed as a rectangle.

According to yet another embodiment, there is a smaller pitch between the light emitting elements arranged on the outer frame than the pitch between the light emitting elements arranged in the inner uniform pattern. Thereby, a higher intensity of light may be emitted from the outer frame of light emitting elements, than from the light emitting elements arranged in the inner uniform pattern.

According to another embodiment, each of the finger portions extends from a first edge of the base portion. Thereby, the finger portions in the PCB are arranged on the same side of the base, which facilitates making another PCB from the PCB panel material derived from the apertures between the finger portions of the PCB.

According to yet another embodiment, the finger portions are distributed with a constant pitch along the first edge of the base portion. Thereby, an even light distribution is facilitated.

Furthermore, according to the invention there is provided a light output device comprising a PCB according to any one of the embodiments above, a light emitting element driver, an optical cover, a cable electrically connected between the light emitting element driver and the PCB, and a light output device housing. The advantages of such a light output device are largely analogous to the advantages as described above. Moreover, a light output device with few components and a low cost PCB component enables providing a light output device with a total low cost. Further, the PCB in the light output device enables the light output device to generate a uniform light distribution.

According to another embodiment, the height of the optical cover is smaller than, or the same as, the depth of the light output device housing.

According to yet another embodiment, the light output device housing is pan formed with slanted edges for reflecting the light emitted from the light output device. With a height of the optical cover being smaller than the depth of the light output device housing with a design according to above, light emitted through the optical cover may be reflected from the light output device housing. Thereby, a desired, predefined, light distribution may be achieved.

According to another embodiment, the light output device comprises two or more PCBs according to any of the embodiments as described above, wherein the PCBs are arranged in juxtaposition. For example, the end sides of the finger portions of the PCBs are arranged to be adjacent. Thereby, a light output device of basically any dimension may be provided using the PCBs according to the inventive concept.

Additionally, there is provided a method for manufacturing at least two PCBs according to any of the embodiments above, comprising the steps of providing a PCB panel, providing electrical connections on the PCB panel, providing light emitting elements on the PCB panel, and dividing the PCB panel into two PCBs each constituting a PCB according to any of the embodiments as described above. Thereby, a manufacturing method with less waste of PCB panel material is achieved, which contributes to a reduction of costs in manufacturing.

According to one embodiment, the PCB panel is divided into several intermediate sized PCB panels before placing the light emitting elements on the PCBs. According to another embodiment, subsequently, the light emitting elements are arranged on the intermediate sized PCB panel and thereafter divided into two PCBs according to any of the embodiments as described above. In one embodiment, the two PCBs are not separated until the PCBs are to be assembled in a light output device. Thereby, transportation of the PCBs is facilitated, as there is half the number of details to transport from the manufacturing site to the assembly site.

According to yet another embodiment, the step of dividing the PCB panel into several PCBs according to any of the embodiments above, is executed before providing the light emitting elements.

Furthermore, according to the invention a printed circuit board panel is provided comprising at least two printed circuit boards according to any of the embodiments described above and which are arranged on said printed circuit board panel in a nested design in which the printed circuit boards are positioned on the printed circuit board panel in interdigitated pairs.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

The invention, including its particular features and advantages, will be readily understood from the following detailed description and the accompanying drawings, in which.

DETAILED DESCRIPTION

Figure 1A:
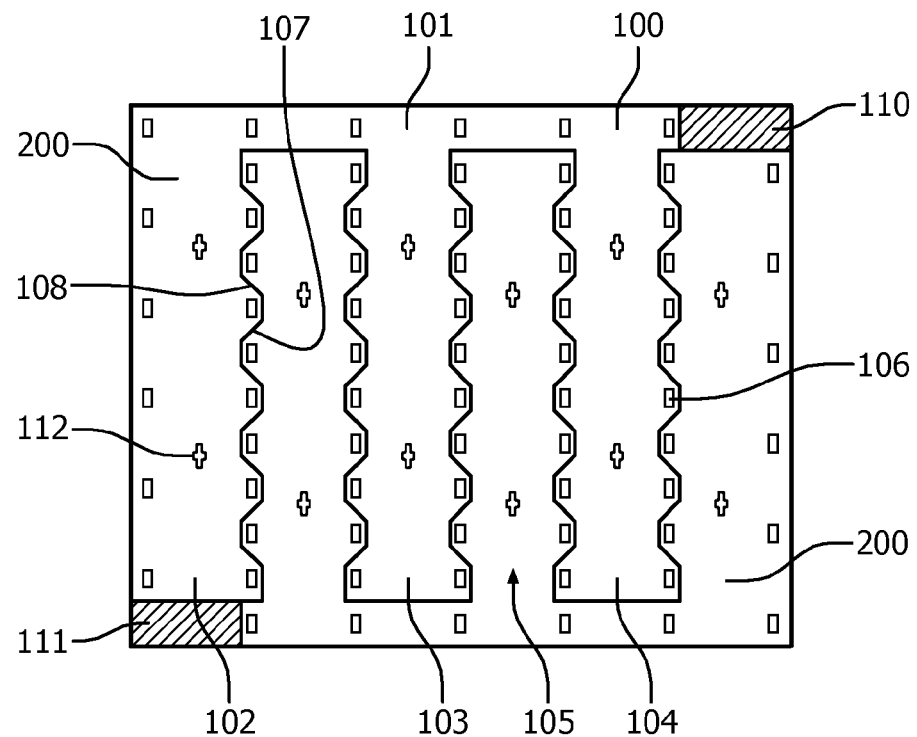
FIGS. 1a and 1b schematically illustrates a top view of a PCB according to an embodiment of the invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

FIG. 1a illustrates a top view of a PCB panel comprising a first PCB 100 and a second PCB 200. With the design shown in the embodiment in FIG. 1a, where the first PCB 100 and the second PCB 200 are arranged in a nested design, in which the first and second PCB are positioned on the PCB panel in interdigitated pairs, the only area of the PCB panel which is not used, i.e. forming waste portions 110, 111, is in two opposing corners of the PCB panel. In this specific embodiment, the first PCB 100 and the second PCB 200 are about 340 mm×340 mm each. Thereby, a total of 18 PCBs can be cut from an exemplary PCB panel with the standard size of 1020 mm×1220 mm, as compared to only 12 PCBs with a standard square design of 300 mm×300 mm can be cut out from the same size PCB panel. Thus, with the design of FIG. 1a, it is possible to save one third of the material cost for a PCB panel.

The first PCB 100 is identical to the second PCB 200 in FIG. 1a. Each PCB comprises a base portion 101 extending in a longitudinal direction. One side of the base portion 101 defines an outer side of each PCB. Further, each PCB comprises a first outer finger portion 102 defining another outer side of the PCB. Moreover, the finger portion 102 has an inner side with protrusions 107 that extend in a direction that is substantially perpendicular to the main, or length, direction of the finger portion. There are five protrusions in the embodiment shown in FIG. 1a. Between the protrusions 107 there are apertures 108. In this embodiment, the apertures have a form that corresponds to the protrusions so that the apertures 108 on the first PCB 100 correspond to the protrusions on the second PCB 200. The first outer finger portion 102 extends in a transversal direction relative the base portion 101, which in a direction that is substantial perpendicular to the length direction of the base portion 101. The first finger portion 102 comprises two rows of light emitting elements 106. The two rows of light emitting elements 106 are aligned in the extension, or length, direction of the finger portion 102 and light emitting elements 106 of one of the rows are positioned on the protrusions 107 of the first finger portion 102.

Moreover, each PCB 100, 200 comprises an intermediate finger portion 103. In other embodiments, there may be several intermediate finger portions. In this embodiment, the intermediate finger portion 103 is symmetrical, so that if the intermediate finger portion 103 would be divided along its general extension's center line the left portion would be identical, but mirrored, to the right portion. Further, the intermediate finger portion 103 has two outer sides with protrusions 107 and aperture 108. The protrusions each have a light emitting element 106 arranged on it. In an alternative embodiment the intermediate finger portion 103 is not symmetrical, for example wherein a protrusion on one side of the intermediate finger 103 has a corresponding aperture on the opposing side of the intermediate finger 103.

Further, each PCB 100, 200 comprises a third finger portion 104. In this embodiment, also the third finger portion 104 is symmetrical, so that if the third finger portion 104 would be divided along its general extension's center line the left portion would be identical, but mirrored, to the right portion. Further, the third finger portion 104 has two outer sides with protrusions 107 and apertures 108. The protrusions each have a light emitting element 106 arranged on it. In the embodiment as shown in FIG. 1a, the third finger portion 104 is identical to the intermediate finger portion 103. Moreover, one side of the third finger portion 104 defines an outer side of each PCB 100, 200. Furtheromre, in an alternative embodiment the intermediate finger portion 104 may be not symmetrical In the embodiment in FIG. 1a, the protrusions 107 and apertures 108 of each finger portion 102, 103, 104 are longitudinally aligned, forming a 5×6 uniform pattern. Further, the light emitting elements 106 that are arranged on the base portion 101 are transversally aligned compared to the light emitting elements 106 that are arranged on the finger portions 102, 103, 104 so that each PCB comprises a uniform pattern of 6×6 light emitting elements 106. Thereby, a uniform light distribution may be achieved.

Moreover, each finger portion 102, 103, 104 may comprise fastening apertures 112 for fastening the fingers to a base or support structure (not shown). In the embodiment in FIG. 1a, each finger comprises two fastening apertures 112. The fastening aperture may be formed with a center portion having a larger longitudinal width than a top portion and a bottom portion. Thereby a screw head may pass the center portion but not the top portion or bottom portion, thereby alleviating installations.

In this embodiment, the finger portions 102, 103, 104 extend in a transversal direction perpendicularly relative to the base portion 101. However, it would be possible that the finger portions 102, 103, 104 would extend in a transversal direction not being perpendicular relative the base portion 101. For example, the finger portions 102, 103, 104 may define an angle between 20 and 160 degrees relative the base portion 101 or they may have a meandering form.

Figure 1B:
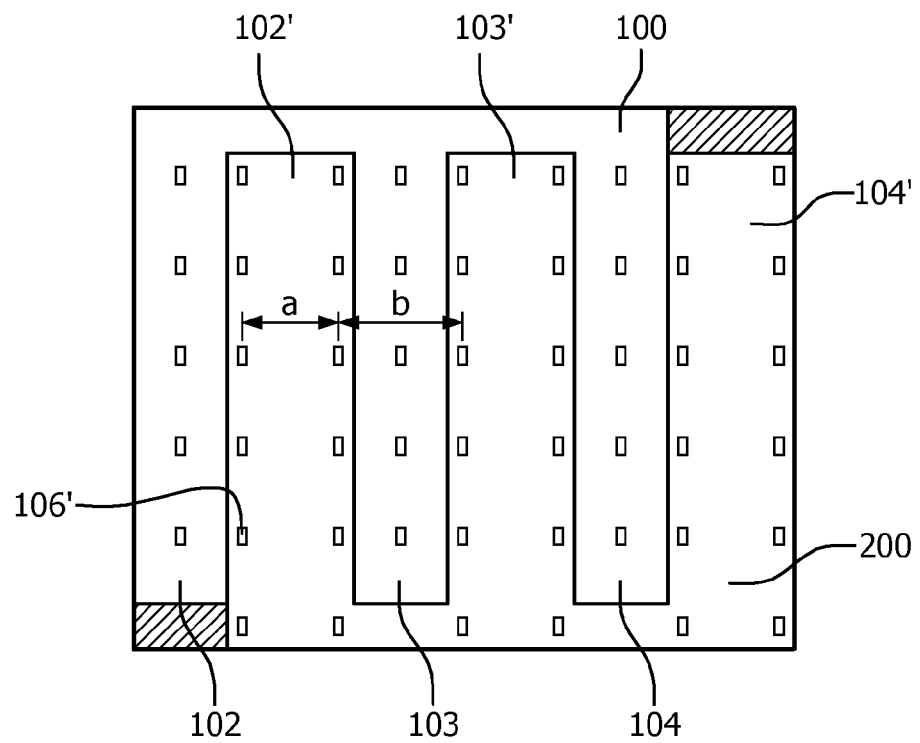

In FIG. 1b an example is shown in which the first PCB 100 and the second PCB 200 are not identical. Both have rectangular fingers, but in this example the width of the fingers 102, 103, 104 is different from the width of the fingers 102', 103', 104'. For example in this example the fingers 102, 103, 104 comprise a single row of LEDs and the fingers 102', 103', 104' comprise a double row of LEDs. The width of the fingers may be designed in such a way that the pitch between the rows of LEDs on one finger (a) is equal to the pitch (b) of adjacent rows of LEDs on adjacent fingers. In this case, the differently configured PCBs may for example be used in different lighting devices.

Figure 4:
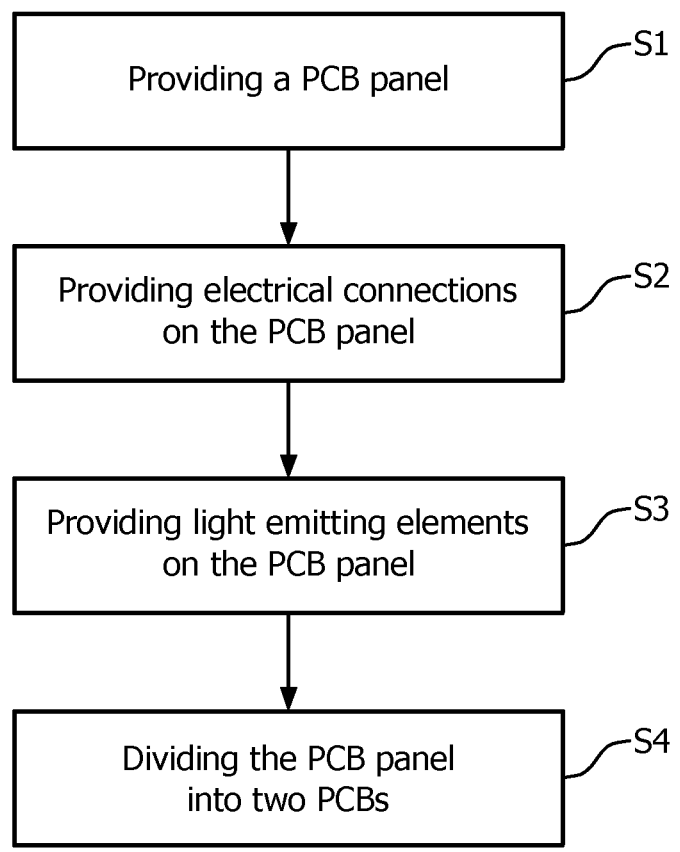
FIG. 4 is a flow chart illustrating the steps of a method of manufacturing a PCB according to an embodiment of the invention.

Two LED modules may be manufactured by conducting the steps as described in FIG. 4. In a first step S1 a PCB panel is provided. In some embodiments, as described above, the PCB panel may be a 1020 mm×1220 mm panel. The second step S2 is to provide electrical connections on the PCB panel. In a next step S3 the light emitting elements 106, such as LEDs, are provided on the PCB panel. The LEDs may be provided in a pattern of straight lines.

In some embodiments, the LEDs may be provided in an inner pattern, e.g. 4×5 LEDs, and an outer frame, e.g. with 24 LEDs, bringing a total of 44 LEDs per LED module. That is, since in this embodiment at least two LED modules with 44 LEDs each are manufactured simultaneously, at least 88 LEDs are distributed in this step. In one embodiment, at total of 18 LED modules are manufactured in parallel on the PCB panel. Thus, 792 LEDs are distributed in this step S3 in the embodiment on a total of 18 PCBs thereby forming 18 LED modules.

In a next step S4, after providing the electrical connections and the light emitting elements, the PCB panel is divided into a plurality of LED modules. The separation may be done by e.g. a special stamping tool, sawing or machining.

By separating the LED modules in the last step (not shown in FIG. 4), manufacturing is simplified since larger components may be handled. Further, fewer transportations are required when using pick-and-place or other equivalent equipment.

Figure 3A:
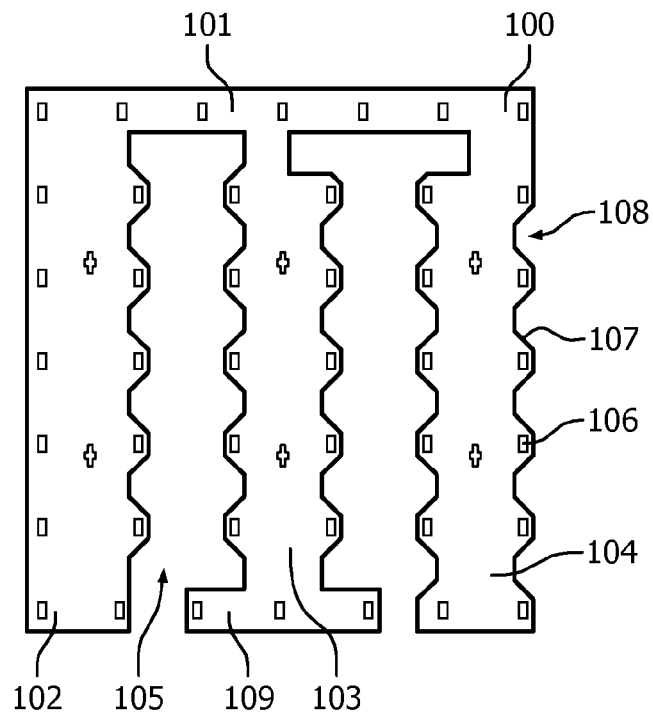
Figure 3B:
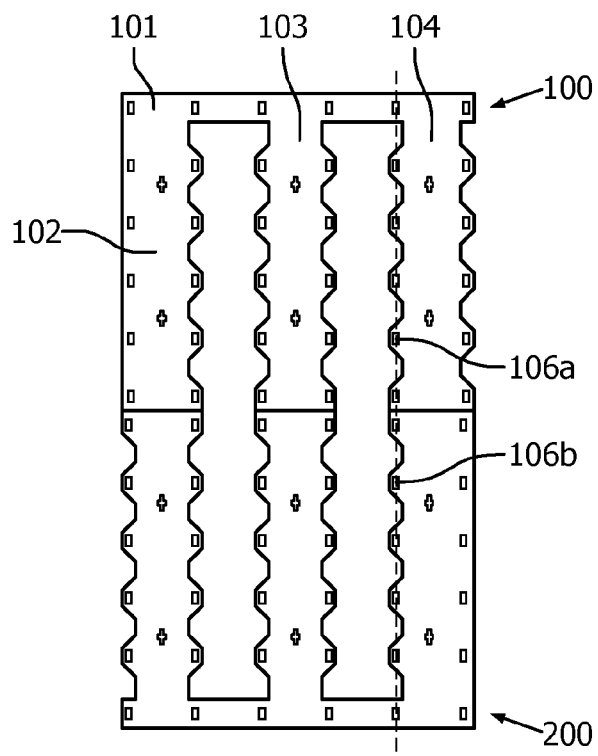

Further, the design of the LED modules allows for the LEDs 106a, 106b to be arranged on the first and second PCB 100, 200 to form aligned rows of LEDs when the LED modules are arranged juxtaposed as shown in FIG. 3b. In FIG. 3b, the first and second PCB 100, 200 are arranged with the finger portions 102, 103, 104 of each PCB facing each other, thus the base portions are arranged on a distance from each other and parallel to each other. Thereby, each transversal row of LEDs 106a on the first PCB 100 is aligned with a corresponding transversal row of LEDs 106b on the second PCB 200.

Moreover, if the two LED modules are arranged juxtaposed so that the base portion 101 of the first PCB 100 extends in the same direction as the base portion of the second PCB 200 (not shown), each longitudinal row of LEDs 106a on the base and on the finger portions arranged on the first PCB 100 is aligned with a corresponding longitudinal row of LEDs 106b on the second PCB 200. Thereby, a system comprising a plurality of LED modules may be provided in which the LED modules are distributed in a longitudinal and/or transversal direction, and with a maintained uniform light distribution as desired.

Figure 2A:
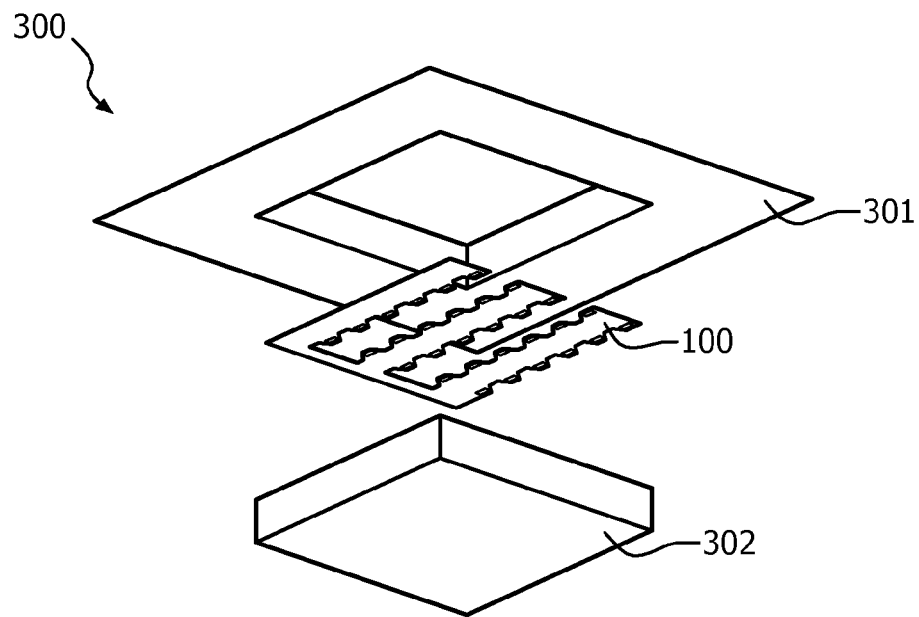
FIG. 2a illustrates an exploded view of a 2×2 feet luminaire according to an embodiment of the invention.

In FIG. 2a, a light output device 300 is illustrated in an exploded view. The light output device may be a luminaire. The light output device 300 comprises the first PCB 100, or the second PCB 200, with the base finger design as described above. Moreover, it comprises an optical cover 302 for covering the light emitting elements on the first PCB 100. The optical cover 302 is adapted for allowing light to be emitted through the cover. Thereby, the material chosen for the optical cover is preferably at least partly transparent. Moreover, the light output device 300 comprises a housing 301 for the light output device.

In one embodiment the light output device further has a light emitting element driver (not shown), for providing power to the light emitting elements. Moreover, the light output device preferably comprises a cable, or other electrical connection, (not shown) electrically connected between the light emitting element driver and the PCB.

In the embodiment as shown in FIG. 2a, the height of the optical cover 302 is smaller than the depth of the light output device housing 301. Also the light output device housing 301 may be pan formed with slanted edges for reflecting the light emitted from the light output device 300.

Figure 2B:
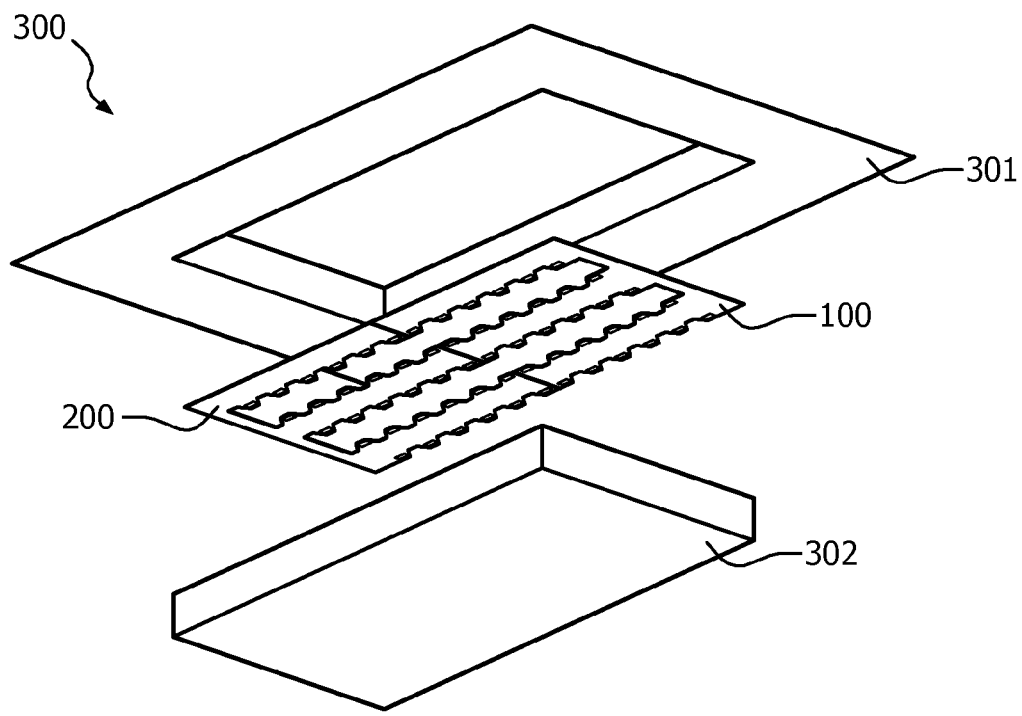
FIG. 2b illustrates an exploded view of a 2×4 feet luminaire according to an embodiment of the invention, FIG. 3a schematically illustrates a top view of PCB according to another embodiment, of the invention, FIG. 3b schematically illustrates a top view of two PCBs arranged in juxtaposition.

In FIG. 2b, another embodiment of a light output device 300 is illustrated in an exploded view. Also this light output device may be a luminaire. In the embodiment as shown in FIG. 2b, the light output device 300 comprises two PCBs 100, 200 arranged in juxtaposition. The PCBs 100, 200 are designed as described above and are rotated so that the end sides of the finger portions 102, 103, 104 of each PCB 100, 200 are arranged adjacent to each other. In other embodiments, a light output device may comprise a plurality of PCBs, allowing a light output device of substantially any size.

FIG. 3a illustrates a top view of a PCB panel according to another embodiment. The PCB in FIG. 3a is substantially the same as the one shown in FIG. 1a. However, there are some important differences. When the first PCB 100 of FIG. 1a allows for a 6×6 uniform pattern of light emitting elements 106, the design as shown in FIG. 3a allows for an inner pattern of 4×5 uniformly distributed light emitting elements and an outer frame of 24 light emitting elements.

The outer frame of light emitting elements 106 is constituted by seven light emitting elements 106 arranged in a longitudinally aligned row on the base portion 101, seven light emitting elements 106 in each row of two transversally arrange rows arranged on the two outer finger portions 102, 104, respectively, and seven light emitting elements 106 longitudinally arranged on the outer end of the finger portions 102, 103, 104, whereby the light emitting elements arranged in the corners each form a part of two rows, one being longitudinal and one being transversal.

In order to be able to uniformly distribute the light emitting elements 106 longitudinally arranged on the outer ends of the finger portions 102, 103, 104, the intermediate finger portion 103 comprises an end portion 109 protruding longitudinally, so that aligned light emitting elements may be longitudinally arranged on the end portion 109. In an embodiment with several intermediate finger portions 103, each of the intermediate finger portions may have an end portion 109 protruding longitudinally.

Moreover, to be able to utilize a PCB panel efficiently with the design as shown in FIG. 3a, the aperture 105 defined between the intermediate finger portion 103 and the third finger portion 104 has a shape corresponding to the shape of the intermediate finger portion. Thereby, the aperture has a longitudinally extended shape corresponding to the end portion 109 of the intermediate finger portion 103.

With the embodiment as shown in FIG. 3a, the PCB comprises 44 light emitting elements in total. Many existing luminaires use four strings of 11 LEDs, alternative 4×5+4×6 LEDs, i.e. the same amount of LEDs as the amount of light emitting elements 106 in the embodiment above. In the embodiment where the light emitting elements 106 are light emitting diodes, the PCB may be powered with 33 V, which is the same as is used in many 44 LED luminaires today. Thereby, the cost can be kept low also for the power supply components. Mutatis mutandis, the embodiment with a number of PCBs arranged juxtaposed will all be powered by the same number times 33 V, i.e. 66V, 99V etc.

In summary, there is by means of the invention provided a PCB comprising several "finger portions" projecting from a "base portion", wherein each finger portion is provided with a plurality of light emitting elements. By means of the invention it is possible to optimize the physical size of the PCB such that a resulting LED module requires less PCB area per thereon arranged LED, thereby decreasing the cost of the overall LED module.

Even though the invention has been described with reference to specific embodiments thereof, many different alterations, modifications and the like will become apparent for those skilled in the art. For example, the PCBs may have fewer or more light emitting elements, there may be more finger portions extending from the base etc. Parts of the system may be omitted, interchanged or arranged in various ways, not affecting the general inventive concept.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage.

The invention claimed is:

1. A printed circuit board comprising:
   a base portion,
   at least three finger portions extending in a transversal direction with respect to said base portion and being substantially parallel to each other,
   wherein two adjacent finger portions define an intermediate aperture with a shape corresponding to at least one of the finger portions, wherein the at least three finger portions each have a plurality of longitudinal protrusions distributed along at least a first side of the at least three finger portions, wherein each of the at least two finger portions is provided with a plurality of light emitting elements aligned in a first and a second row and wherein light emitting elements of at least one of the first or the second row are arranged on the protrusions, wherein an intermediate finger portion comprises an end portion protruding longitudinally, wherein light emitting elements are arranged on the end portion.

2. The printed circuit board according to claim 1, wherein the first side of the finger portions each forms a meandering contour.

3. The printed circuit board according to claim 1, wherein two adjacent longitudinal protrusions define an intermediate aperture with a shape corresponding to at least one of the longitudinal protrusions.

4. The printed circuit board according to claim 3, comprising a plurality of finger portions extending in a transversal direction, wherein all intermediate finger portions comprise an end portion protruding longitudinally, wherein light emitting elements are arranged on the end portions.

5. The printed circuit board according to claim 4, comprising light emitting elements distributed so that the light emitting elements form an outer frame and an inner uniform pattern.

6. The printed circuit board according to claim 5, wherein the outer frame is formed by light emitting elements arranged on the base portion, the end portions protruding longitudinally from the intermediate finger portions and the two outermost arranged finger portions.

7. The printed circuit board according to claim 6, wherein there is a smaller pitch between the light emitting elements arranged on the outer frame than the pitch between the light emitting elements arranged in the inner uniform pattern.

8. The printed circuit board according to claim 7, wherein each of the finger portions extends from a first edge of the base portion.

9. The printed circuit board according to claim 8, wherein the finger portions are distributed with a constant pitch along the first edge of the base portion.

10. Light output device comprising
    a printed circuit board according to claim 9;
    a light emitting element-driver;
    an optical cover;
    a cable electrically connected between the light emitting element-driver and the printed circuit board, and
    a housing.

11. Light output device according to claim 10, comprising at least two printed circuit boards, wherein the printed circuit boards are arranged juxtaposed.

12. Method for manufacturing at least two printed circuit boards according to claim 9, comprising the steps of:
    providing a printed circuit board panel;
    providing electrical connections on the printed circuit board panel;
    providing light emitting elements on the printed circuit board panel; and
    dividing the printed circuit board panel into at least two printed circuit boards, each printed circuit board constituting a printed circuit board.

13. A printed circuit board panel comprising at least two printed circuit boards according to claim 9 which are arranged on said printed circuit board panel in a nested design in which the printed circuit boards are positioned on the printed circuit board panel in interdigitated pairs.

* * * * *